(12) United States Patent
Ohta et al.

(10) Patent No.: US 10,109,782 B2
(45) Date of Patent: Oct. 23, 2018

(54) PIEZOELECTRIC ELEMENT AND PIEZOELECTRIC ACTUATOR

(71) Applicant: TDK CORPORATION, Tokyo (JP)

(72) Inventors: Yoshiki Ohta, Tokyo (JP); Kazuo Nagata, Tokyo (JP); Shuto Ono, Tokyo (JP); Shunsuke Ogura, Tokyo (JP); Yuya Sato, Tokyo (JP)

(73) Assignee: TDK CORPORATION, Tokyo (JP)

( * ) Notice: Subject to any disclaimer, the term of this patent is extended or adjusted under 35 U.S.C. 154(b) by 219 days.

(21) Appl. No.: 15/227,249

(22) Filed: Aug. 3, 2016

(65) Prior Publication Data

US 2017/0040525 A1 Feb. 9, 2017

(30) Foreign Application Priority Data

Aug. 6, 2015 (JP) ................... 2015-156317

(51) Int. Cl.
*H01L 41/09* (2006.01)
*H01L 41/047* (2006.01)
*H01L 41/053* (2006.01)
*G11B 5/55* (2006.01)

(52) U.S. Cl.
CPC ............ *H01L 41/09* (2013.01); *G11B 5/5552* (2013.01); *H01L 41/0471* (2013.01); *H01L 41/0474* (2013.01); *H01L 41/053* (2013.01); *H01L 41/0933* (2013.01); *H01L 41/0986* (2013.01)

(58) Field of Classification Search
CPC .............. H01L 41/0471; H01L 41/0474; H01L 41/053; H01L 41/09; H01L 41/0933; H01L 41/0966

USPC ......................................... 310/328, 344, 348
See application file for complete search history.

(56) References Cited

U.S. PATENT DOCUMENTS

| | | | |
|---|---|---|---|
| 7,759,847 B2 * | 7/2010 | Okamura ........... | F02M 51/0603 252/62.9 PZ |
| 2010/0171393 A1 * | 7/2010 | Pei ........................ | H01L 41/094 310/330 |
| 2012/0176703 A1 | 7/2012 | Nojima | |
| 2013/0134835 A1 * | 5/2013 | Kim ..................... | G01S 7/521 310/346 |
| 2016/0196842 A1 | 7/2016 | Nojima | |

FOREIGN PATENT DOCUMENTS

JP    2012-155832 A    8/2012

* cited by examiner

*Primary Examiner* — Derek Rosenau
(74) *Attorney, Agent, or Firm* — Oliff PLC

(57) ABSTRACT

A piezoelectric element includes a piezoelectric body, an external electrode, and an internal electrode. The piezoelectric body includes first and second main surfaces opposing each other. The external electrode is disposed on the first main surface and has a first polarity. The internal electrode is disposed in the piezoelectric body to oppose the external electrode in a direction in which the first main surface and the second main surface oppose each other and has a second polarity different from the first polarity. A region from the internal electrode to the external electrode in the piezoelectric body is a polarizing region, and a region from the internal electrode to the second main surface in the piezoelectric body is a non-polarizing region.

5 Claims, 11 Drawing Sheets

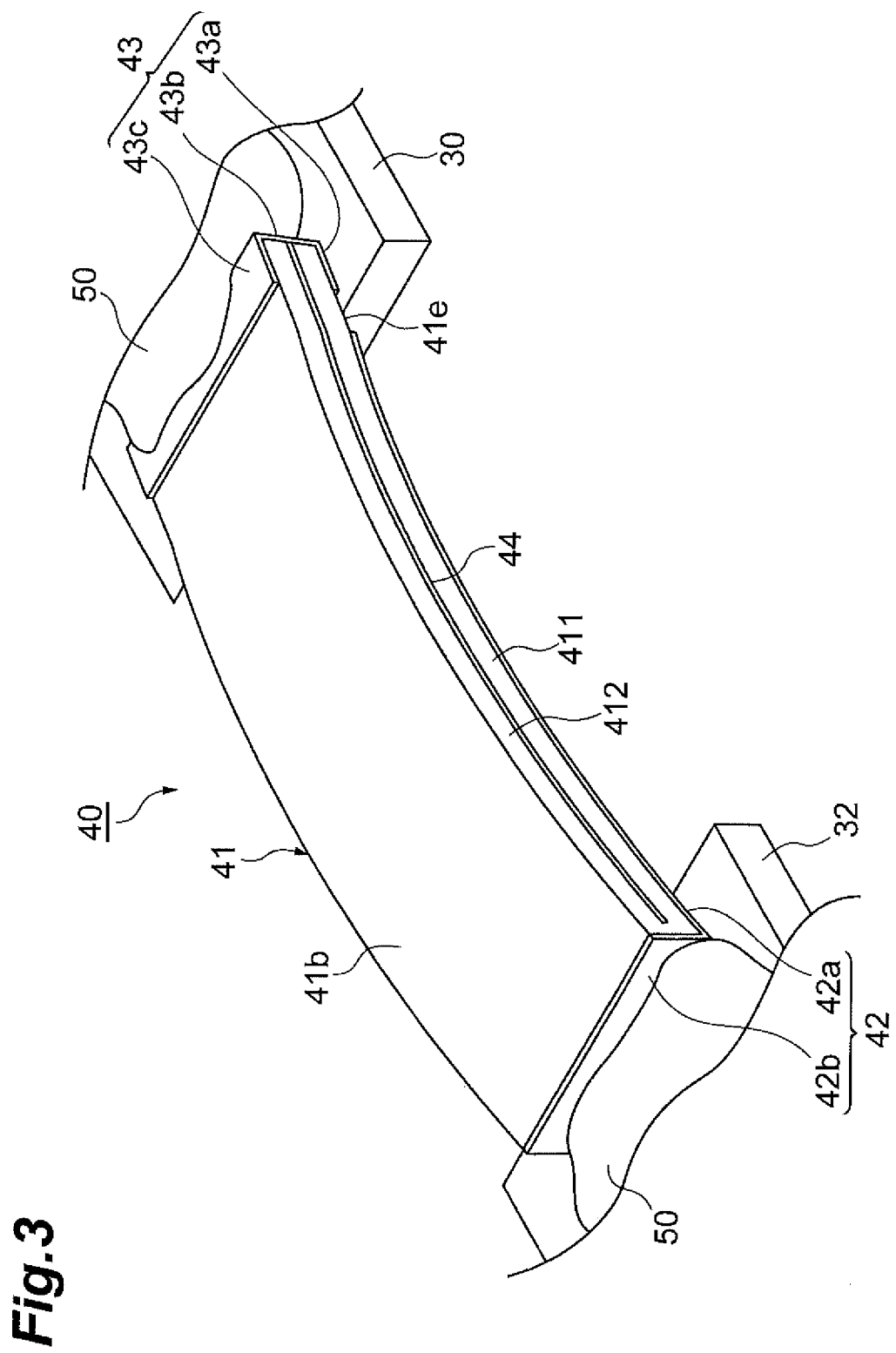

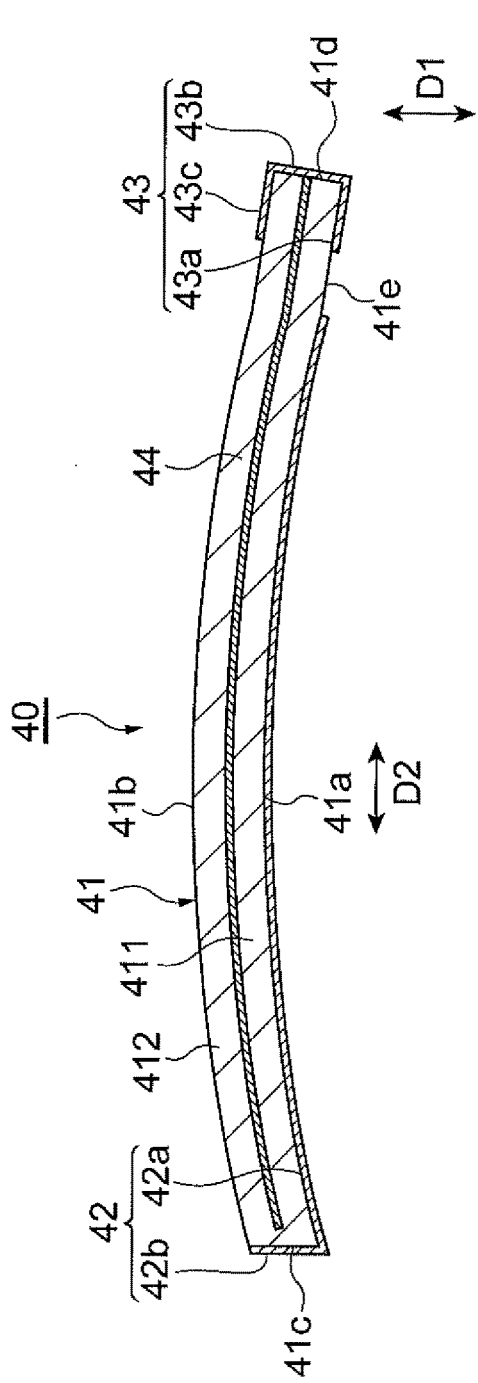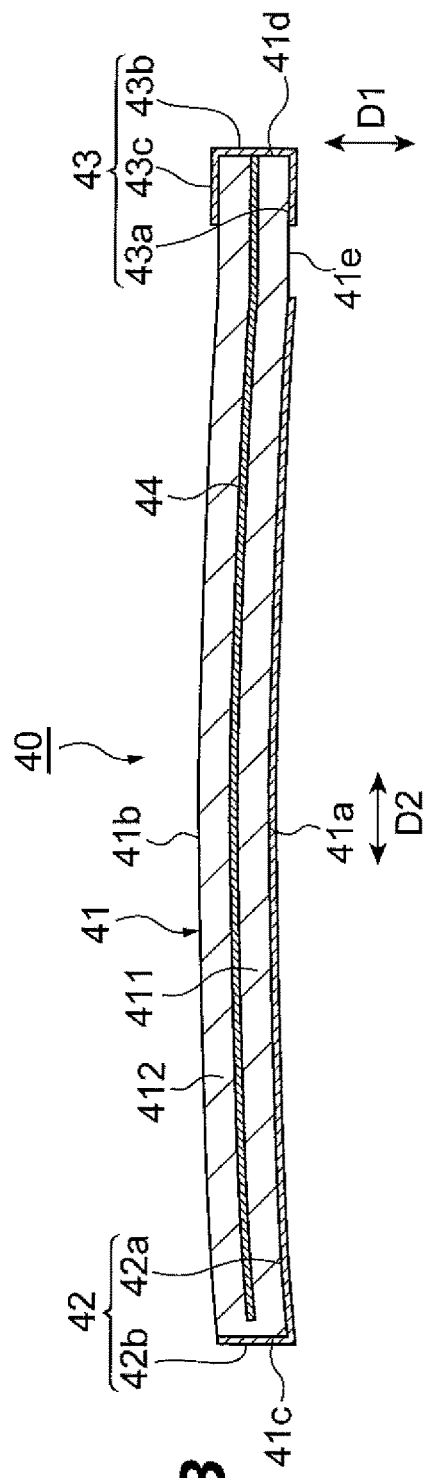

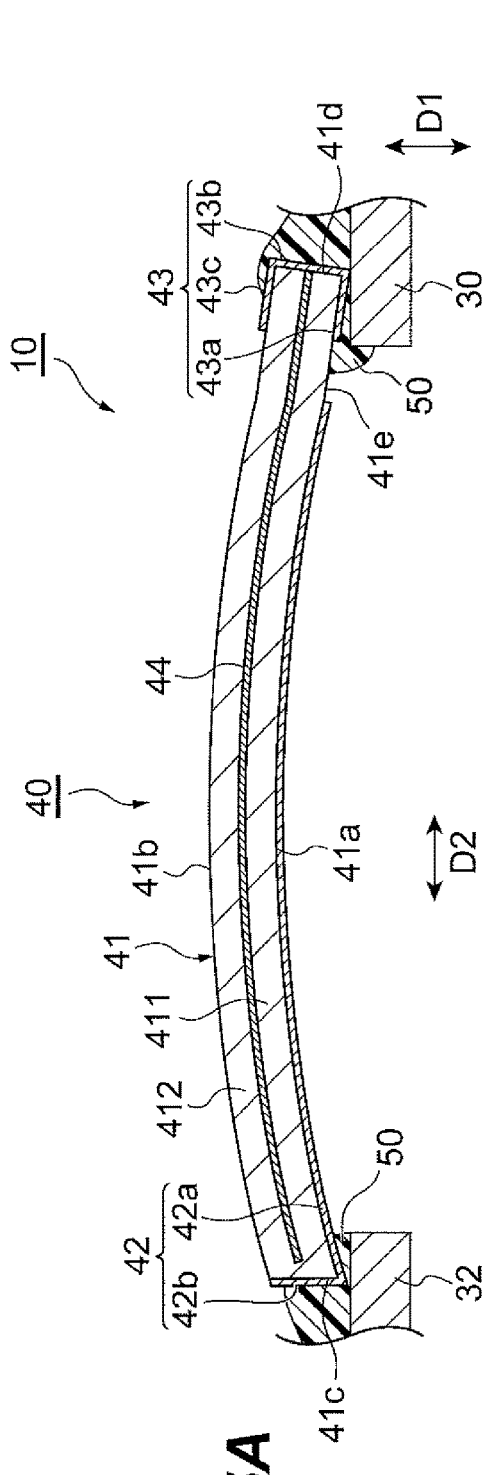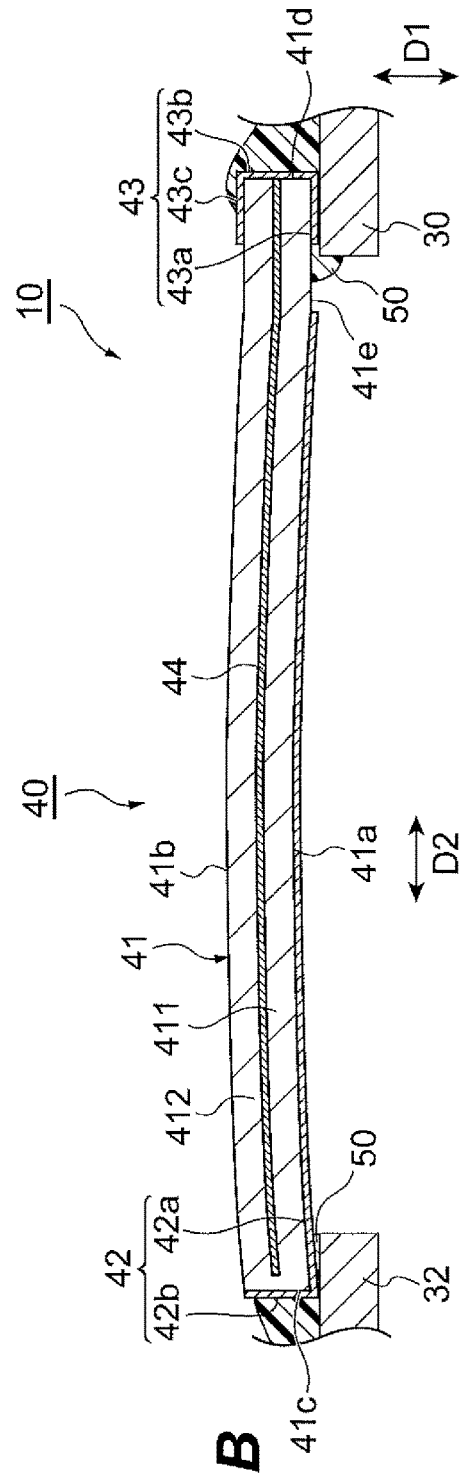

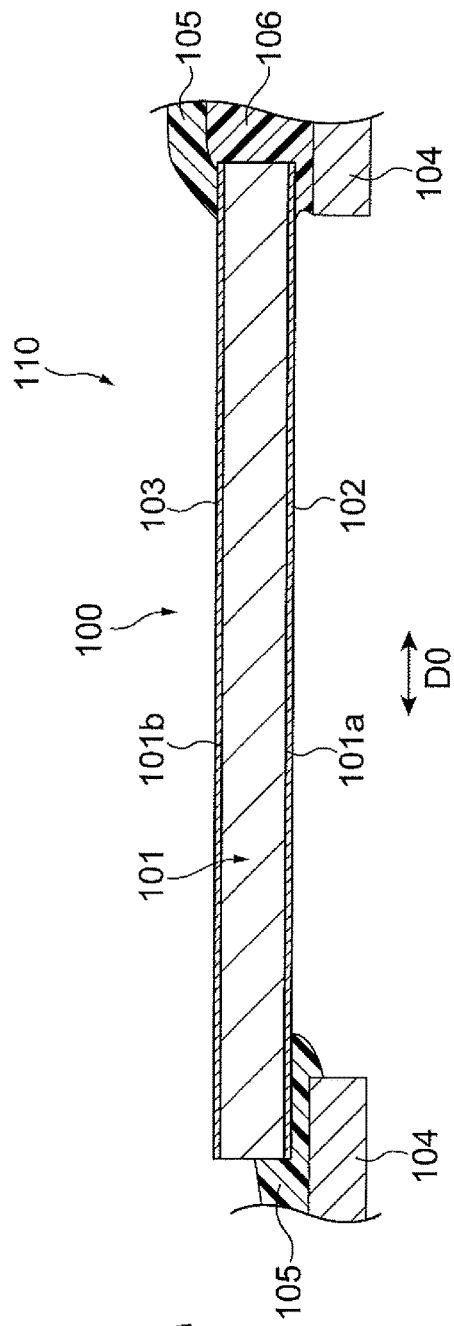
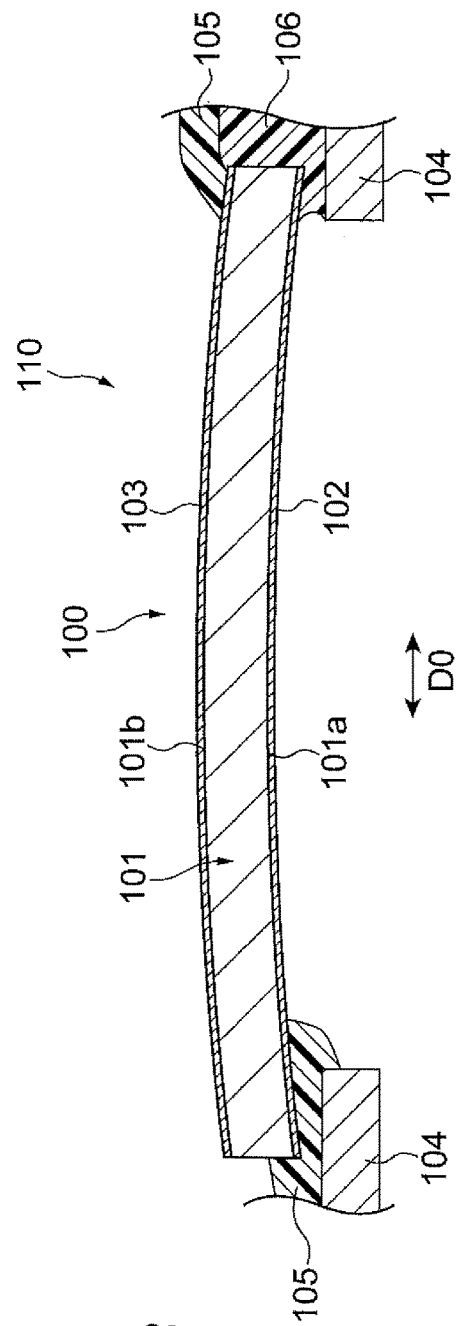

PIEZOELECTRIC ELEMENT AND PIEZOELECTRIC ACTUATOR

TECHNICAL FIELD

One aspect of the present invention relates to a piezoelectric element and a piezoelectric actuator.

BACKGROUND

Known piezoelectric actuators include a piezoelectric element including first and second main surfaces opposing each other and a supporting member supporting the piezoelectric element (for example, refer to JP 2012-155832 A). In the piezoelectric actuator described in JP 2012-155832 A, an actuator base of a suspension for a hard disk device (HDD) corresponds to the above-described supporting member. The piezoelectric element transmits displacement of the piezoelectric element to the actuator base.

SUMMARY

One aspect of the present invention is to provide a piezoelectric element and a piezoelectric actuator with their variation of displacement suppressed.

Inventors of the present invention have researched a piezoelectric element with its variation of displacement suppressed. As a result, the inventors have found out the following facts and reached the present invention.

A variation of displacement in a piezoelectric element is caused by a shape of a piezoelectric element. That is, the shape of a piezoelectric element has an influence on the displacement of the piezoelectric element, and therefore variation of the shape causes variation of the displacement. Generally, a piezoelectric element is formed through a firing process of a piezoelectric ceramic material. After the firing process of the piezoelectric ceramic material, the piezoelectric element may be distorted or bent. The distortion and bending are not easily controlled in a uniform manner between piezoelectric elements and is likely varied for each piezoelectric element. Consequently, shapes of piezoelectric elements are varied, and displacement of the piezoelectric elements is likely to be varied. Therefore, if variation of the shapes of the piezoelectric elements can be suppressed, piezoelectric elements with its variation of displacement suppressed can be realized.

Therefore, the piezoelectric element according to one aspect of the present invention includes a piezoelectric body, an external electrode, and an internal electrode. The piezoelectric body includes first and second main surfaces opposing each other. The external electrode is disposed on the first main surface. The external electrode has a first polarity. The internal electrode is disposed in the piezoelectric body to oppose the external electrode in a direction in which the first main surface and the second main surface oppose each other. The internal electrode has a second polarity, which is different from the first polarity. A region from the internal electrode to the external electrode in the piezoelectric body is a polarizing region. A region from the internal electrode to the second main surface in the piezoelectric body is a non-polarizing region.

In the piezoelectric element according to one aspect of the present invention, the polarizing region is disposed on the first main surface side, and the non-polarizing region is disposed on the second main surface side. Distortion due to polarization is remained in the polarizing region. Therefore, the piezoelectric element has a bent shape in which the first main surface comes to a curved inner side. The shape of the piezoelectric element is controlled by bending of the piezoelectric element caused by the polarizing region and the non-polarizing region. Therefore, variation of the shapes of the piezoelectric elements is hardly caused. As a result, according to one aspect of the present invention, piezoelectric elements with its variation of displacement suppressed can be realized.

A distance from an internal electrode to an external electrode may be equal to or more than a distance from the internal electrode to a second main surface. In this case, a thickness of the polarizing region is equal to or more than a thickness of the non-polarizing region. Therefore, for example, the piezoelectric element has certainly a bent shape in comparison with a piezoelectric element in which a thickness of the polarizing region is less than a thickness of the non-polarizing region. As a result, piezoelectric elements with its variation of displacement more certainly suppressed can be realized.

A thickness of the above-described piezoelectric elements may be equal to or less than 100 μm. A piezoelectric element of which thickness is equal to or less than 100 μm is more significantly affected by distortion remained in a polarizing region than a piezoelectric element of which thickness is equal to or over than 100 μm. Therefore, in the case where the thickness of a piezoelectric element is equal to or lower than 100 μm, the piezoelectric element certainly has a bent shape.

A piezoelectric actuator according to one aspect of the present invention includes the above-described piezoelectric element and a supporting member for supporting a first main surface of a piezoelectric element via adhesive resin.

The piezoelectric actuator according to one aspect of the present invention includes the above-described piezoelectric element, and therefore its variation of displacement is suppressed. In addition, an external electrode of the piezoelectric element is disposed on a first main surface, and therefore an adhesive area between the adhesive resin and the external electrode provided to the supporting member can be enlarged.

BRIEF DESCRIPTION OF THE DRAWINGS

FIG. 3 is a perspective view illustrating a configuration and a fixing structure of a piezoelectric element illustrated in FIG. 1;

FIGS. 4A and 4B are views for describing movement of the piezoelectric element illustrated in FIG. 1;

FIGS. 5A and 5B are views for describing movement of the suspension illustrated in FIG. 1;

FIGS. 11A and 11B are views for describing movement of the suspension illustrated in FIG. 6.

DETAILED DESCRIPTION

With reference to attached drawings, an embodiment according to one aspect of the present invention will be described next. In the description, the same signs are used for the same elements or for elements having the same functions, and a duplicated description will be omitted.

Figure 1:
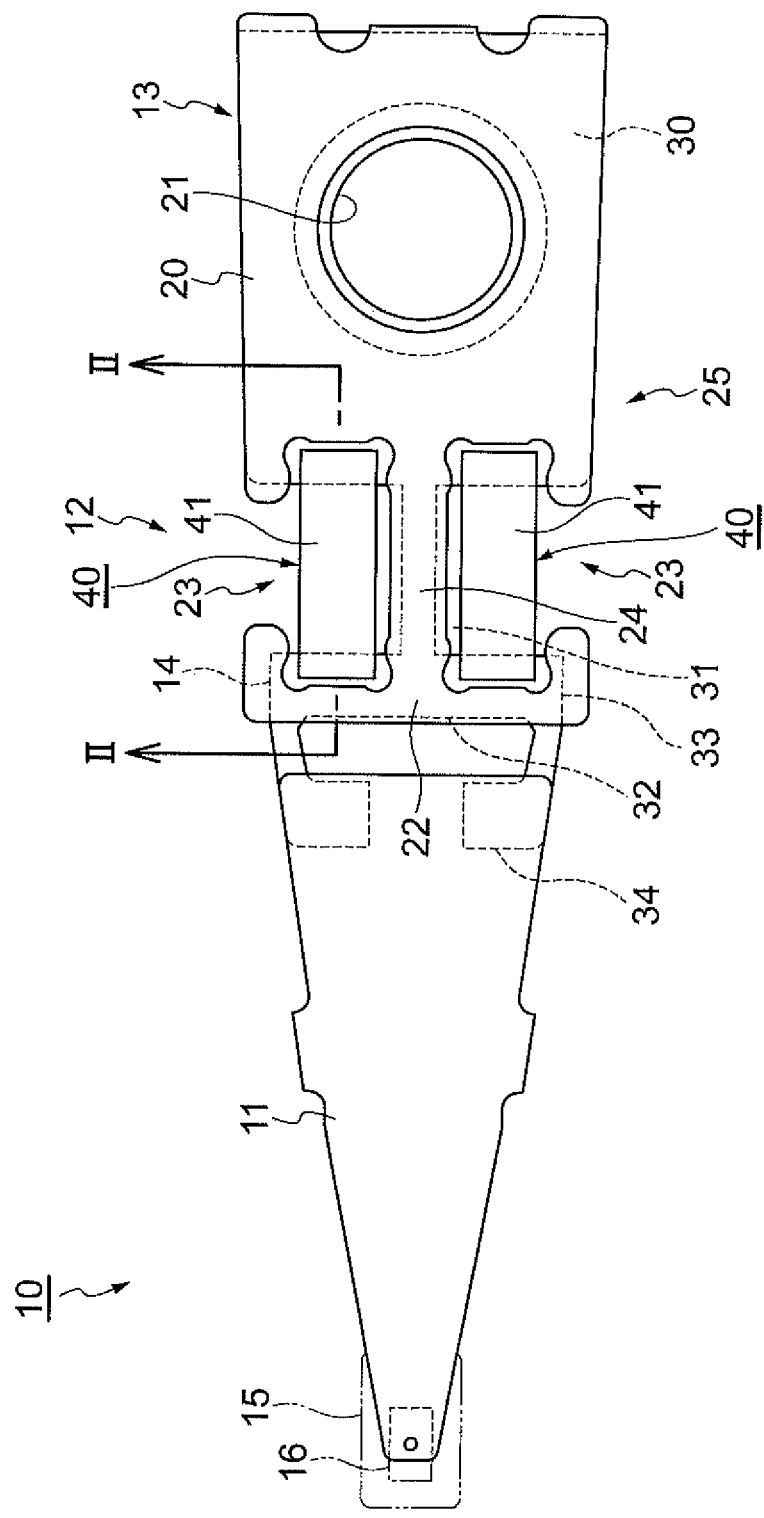
FIG. 1 is a schematic plan view illustrating a suspension according to an embodiment.
Figure 2:
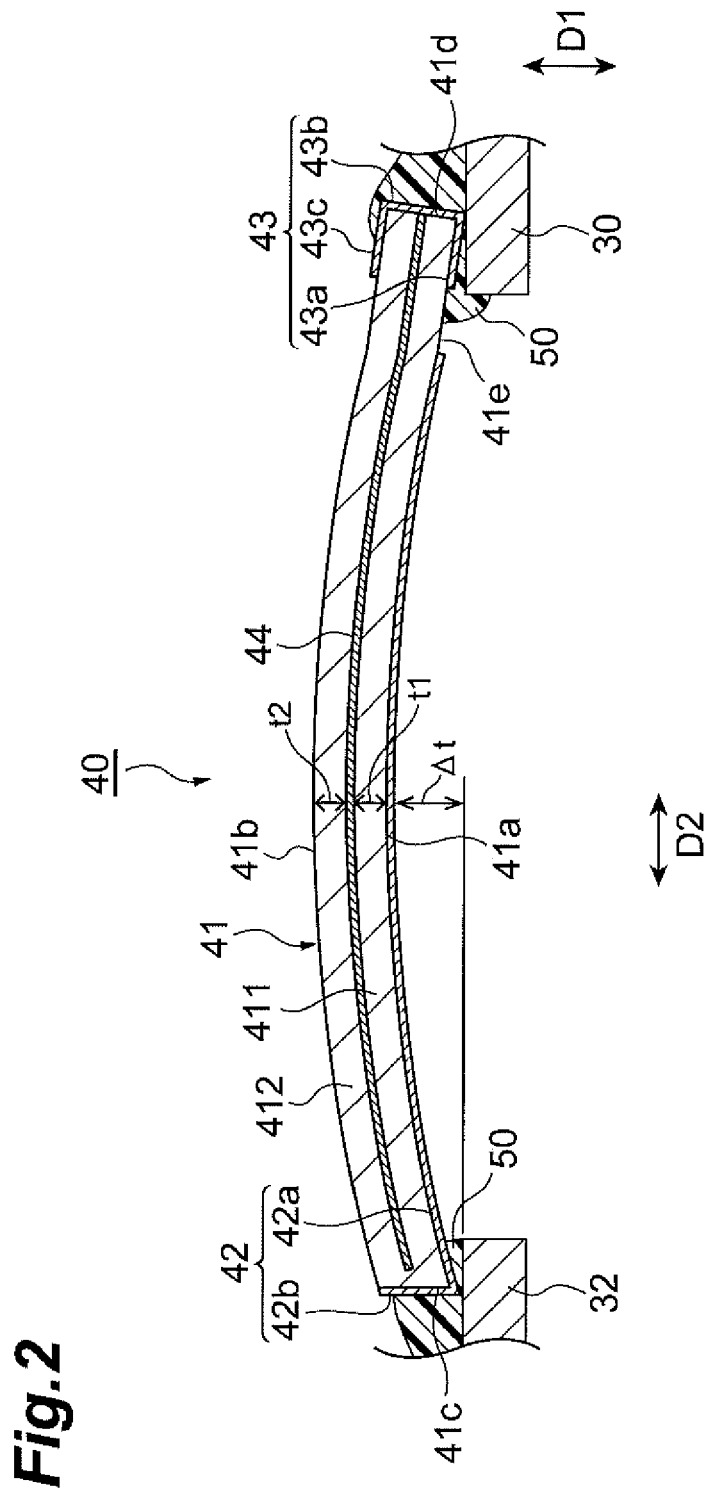
FIG. 2 is a view for describing a sectional configuration taken along line II-II illustrated in FIG. 1.

With reference to FIGS. 1 to 3, a configuration of a piezoelectric actuator according to the embodiment will be described. The embodiment is an example of the case where a suspension 10 for HDD includes the piezoelectric actuator. FIG. 1 is a schematic plan view illustrating a suspension according to the embodiment. FIG. 2 is a view for describing a sectional configuration taken along line II-II illustrated in FIG. 1. FIG. 3 is a perspective view illustrating a configuration and a fixing structure of a piezoelectric element illustrated in FIG. 1.

The suspension 10 by a dual actuator method illustrated in FIG. 1 includes a load beam 11, a micro actuator 12, a base plate 13, and a hinge member 14.

The load beam 11 includes a metal plate having a spring characteristic. A thickness of the load beam 11 is, for example, approximately 100 μm. A flexure 15 is attached at a tip of the load beam 11. The flexure 15 includes a thinner metal spring than the load beam 11. A slider 16 forming a magnetic head is disposed at a front end portion of the flexure 15.

A round boss hole 21 is formed on a base portion 20 of the base plate 13. A pair of openings 23 having a size capable of storing a piezoelectric element 40 to be described later is formed between the base portion 20 of the base plate 13 and a front end portion 22. A belt-like connecting portion 24 which extends in a longitudinal direction of the base plate 13 (a longitudinal direction of the suspension 10) is provided between a pair of the openings 23. The connecting portion 24 is formed so as to allow bending within a predetermined range in a wide direction of the base plate 13 (a direction crossing with the longitudinal direction of the suspension 10).

The base portion 20 of the base plate 13 is fixed at a tip of an actuator arm driven by a voice coil motor (not illustrated). As a result, the base plate 13 is revolvingly driven by the voice coil motor. The base plate 13 includes a metal plate such as a stainless steel. A thickness of the base plate 13 is, for example, approximately 200 μm. In the case of the embodiment, an actuator base 25 includes the base plate 13 and the hinge member 14.

The hinge member 14 includes a base portion 30, a bridge portion 31, an intermediate portion 32, a pair of hinge portions 33, and a tip portion 34. The base portion 30 is stacked and fixed on the base portion 20 of the base plate 13. The bridge portion 31 has a belt shape and is formed at a position corresponding to the connecting portion 24 of the base plate 13. The intermediate portion 32 is formed at a position corresponding to a front end portion 22 of the base plate 13. Each hinge unit 33 has flexibility elastically deformable in a plate thickness direction. The tip portion 34 is fixed on the load beam 11. The hinge member 14 includes a metal plate having a spring property. A thickness of the hinge member 14 is, for example, approximately 50 μm.

A pair of the piezoelectric elements 40 is disposed on the micro actuator 12. Each of the piezoelectric elements 40 is a laminated piezoelectric element. A thickness of the piezoelectric element 40 is, for example, 100 μm or less or 70 μm or less. Each of the piezoelectric elements 40 is, as illustrated in FIG. 2, includes a piezoelectric body 41, a first external electrode 42, a second external electrode 43, and an internal electrode 44.

The piezoelectric body 41 has a rectangular plate shape. The piezoelectric body 41 includes first and second main surfaces 41a and 41b and first and second end surfaces 41c and 41d. The first and second main surfaces 41a and 41b oppose each other in a first direction D1 (thickness direction of the piezoelectric element 40). The first and second end surfaces 41c and 41d oppose each other in a second direction D2 (a longitudinal direction of the piezoelectric element 40). The first and second end surfaces 41c and 41d extend in the first direction D1 to connect the first and second main surfaces 41a and 41b.

An outer size of the piezoelectric body 41 is, for example, 1.5 mm in length, 0.45 mm in width, and 0.05 mm in thickness. Here, the piezoelectric body 41 includes piezoelectric ceramic. Examples of the piezoelectric ceramic include PZT [Pb (Zr, Ti) $O_3$], PT [$PbTiO_3$], PLZT [(Pb, La) (Zr, Ti) $O_3$], and barium titanate [$BaTiO_3$]. The piezoelectric body 41 includes, for example, piezoelectric ceramic material such as PZT.

A region from an electrode portion 42a to the internal electrode 44 in the piezoelectric body 41 is a polarizing region 411. A region from the internal electrode 44 to the second main surface 41b in the piezoelectric body 41 is a non-polarizing region 412. Here, a polarized state is a state in which a direction of spontaneous polarization opposes one direction, and is not a state in which the direction is random. Distortion due to polarization is remained in the polarizing region 411. As a result, the polarizing region 411 extends in the first direction D1 and shrinks in the second direction D2. Therefore, the piezoelectric element 40 is bent such that the first main surface 41a comes to a curved inner side. A bending amount Δt is approximately 10 μm. In FIG. 2, to simplify understanding, the bending amount Δt is exaggeratedly indicated.

The first external electrode 42 includes the electrode portion 42a disposed on the first main surface 41a of the piezoelectric body 41 and the electrode portion 42b disposed on the first end surface 41c.

One end of the second direction D2 of the electrode portion 42a is electrically connected to one end in the first direction D1 of the electrode portion 42b. Another end of the second direction D2 of the electrode portion 42a is separated from the second end surface 41d. A separation distance in the second direction D2 is, for example, 0.1 mm. The electrode portion 42b is disposed to cover substantially all of the first end surface 41c. Thicknesses of the electrode portions 42a and 42b are set to approximately from 200 to 500 nm.

The second external electrode 43 includes an electrode portion 43a disposed on the first main surface 41a, an electrode portion 43b disposed on the second end surface 41d, and an electrode portion 43c disposed on the second main surface 41b.

A length of the second direction D2 of the electrode portion 43a is, for example, 0.1 mm. One end of the second direction D2 of the electrode portion 43a is separated from another end of the second direction D2 of the electrode portion 42a. The separation distance in the second direction D2 is equal to a length of the second direction D2 in an exposed portion 41e and, for example, 0.1 mm. The exposed portion 41e is a portion exposed from the first and second external electrodes 42 and 43 on the first main surface 41a. Another end of the second direction D2 of the electrode portion 43a is electrically connected to one end in the first direction D1 of the electrode portion 43b.

A length of the second direction D2 of the electrode portion 43c is equal to a length of the second direction D2 of the electrode portion 43a. Another end of the electrode portion 43c is electrically connected to another end in the first direction D1 of the electrode portion 43a. Thicknesses of the electrode portions 43a to 43c are set to the same thickness as that of the electrode portions 42a and 42b. That is, the thicknesses of the electrode portions 43a to 43c are approximately set to from 200 to 500 nm.

The first and second external electrodes 42 and 43 have a different polarity each other. That is, in the case where the first external electrode is a positive polarization, the second external electrode is a negative electrode. In the case where the first external electrode is a negative polarization, the second external electrode is a positive electrode. In the embodiment, the first and second external electrodes 42 and 43 have a Cr/Ni-Cu/Au laminated structure (in the structure, a Cr layer, an Ni—Cu alloy layer, and an Au layer are laminated from a piezoelectric body 41 side in order). That is, the first and second external electrodes 42 and 43 have the same laminated structure.

The first and second external electrodes 42 and 43 are formed, for example, by a spattering method. The first and second external electrodes 42 and 43 may be formed by a method other than the spattering method (for example, a baking method, an electrolytic plating method, or a deposition method). The first and second external electrodes 42 and 43 may be formed as a same single metal layer (for example, a Cr layer, an Ni—Cu alloy layer, an Au layer, or an Ni layer). For example, first and the second external electrodes 42 and 43 may include Au or Pt.

The internal electrode 44 is disposed in the piezoelectric body 41. The internal electrode 44 is disposed at a center of the first direction D1 of the piezoelectric body 41. The internal electrode 44 opposes the first and second main surfaces 41a and 41b in the first direction D1. That is, the internal electrode 44 opposes the electrode portion 42a in the first direction D1. The internal electrode 44 is disposed substantially parallel to the first and second main surfaces 41a and 41b. That is, the internal electrode 44 is disposed substantially parallel to the electrode portion 42a.

A distance t1 from the internal electrode 44 to the electrode portion 42a is equal to or more than a distance t2 from the internal electrode 44 to the second main surface 41b. That is, a thickness of the polarizing region 411 (length in the first direction D1) is equal to or more than a thickness of the non-polarizing region 412. Here, the distance t1 is equal to the distance t2. That is, a thickness of the polarizing region 411 is equal to a thickness of the non-polarizing region 412.

One end of the second direction D2 of the internal electrode 44 is separated from the first end surface 41c. The separation distance in the second direction D2 is, for example, 0.1 mm. Another end of the second direction D2 of the internal electrode 44 is connected to the electrode portion 43b. Therefore, the internal electrode 44 and the second external electrode 43 have the same polarity. In the embodiment, the internal electrode 44 includes a conductive material (for example, Ag, Pd, Au, Pt or alloy thereof) generally used as an internal electrode of a laminated electrical element. The internal electrode 44 is formed as a sintered body of conductive paste including the above-described conductive material.

Each piezoelectric element 40 is stored in the corresponding opening 23 in such a manner that a longitudinal direction of the piezoelectric element 40 is along a longitudinal direction of the base plate 13 (an axial direction of the suspension 10.) That is, each piezoelectric element 40 is disposed to the corresponding opening 23.

As illustrated in FIGS. 2 and 3, the first main surface 41a of each piezoelectric element 40 is supported by conductive resin 50 via the hinge member 14. The first main surface 41a may directly come into contact with the conductive resin 50. The first main surface 41a may indirectly come into contact with the conductive resin 50, for example, via the first external electrode 42 or the second external electrode 43. One end of the second direction D2 of the first main surface 41a is fixed to the intermediate portion 32 via the conductive resin 50 to be supported by the intermediate portion 32 of the hinge member 14. Specifically, each of the first end surface 41c side of the electrode portion 42a and the first main surface 41a side of the electrode portion 42b is supported by being fixed to the intermediate portion 32 via the conductive resin 50. The conductive resin 50 is resin including a conductive material (for example, metallic particles) The conductive resin 50 is electrically connected to an electrical wire (not illustrated).

Another end of the second direction D2 of the first main surface 41a is fixed to the base portion 30 via the conductive resin 50 to be supported by the base portion 30 of the hinge member 14. Specifically, each of substantially all of the electrode portion 43a, substantially all of the electrode portion 43b, the second end surface 41d side of the electrode portion 43c, and the second end surface 41d side of the exposed portion 41e is supported by being fixed to the base portion 30 via the conductive resin 50. The conductive resin 50 is electrically connected to an electrical wire (not illustrated).

As described above, the piezoelectric element 40 is bound and supported by the intermediate portion 32 and the base portion 30. The intermediate portion 32 and the base portion 30 function as supporting members binding and supporting the piezoelectric element 40. In the embodiment, the suspension 10 includes a piezoelectric actuator including the piezoelectric element 40 and the supporting members.

Next, with reference to FIGS. 4A, 4B, 5A, and 5B, movement of the piezoelectric element 40 and the suspension 10 (piezoelectric actuator) will be described. FIGS. 4A and 4B are views for describing movement of the piezoelectric element illustrated in FIG. 1. FIGS. 5A and 5B are views for describing movement of the suspension illustrated in FIG. 1.

In the piezoelectric element 40 illustrated in FIG. 4A and the suspension 10 illustrated in FIG. 5A, a voltage is not applied to the first and second external electrodes 42 and 43 and the internal electrode 44. Therefore, an electric field is not applied to the piezoelectric body 41. When the piezoelectric element 40 is driven by applying the voltage to the first and second external electrodes 42 and 43, a predetermined electric field is applied to the polarizing region 411 of the piezoelectric body 41 through the first and second external electrodes 42 and 43 and the internal electrode 44. As a result, the polarizing region 411 extends in the second direction D2. Here, the second direction D2 is a driving direction of the piezoelectric element 40.

In contrast, the non-polarizing region 412 is a piezoelectrically inert region. The non-polarizing region 412 is not displaced even if a voltage is applied to the first and second external electrodes 42 and 43. Consequently, when the piezoelectric element 40 is driven, a displacement amount on the first main surface 41a side becomes larger than a displacement amount on the second main surface 41b side.

Therefore, when the piezoelectric element 40 displaces in a direction in which the piezoelectric element 40 extends, bending of the piezoelectric element 40 is suppressed as illustrated in FIG. 4B and FIG. 5B. As a result, as illustrated in FIG. 5B, the suspension 10 can transmit the displacement of the piezoelectric element 40 to the supporting members.

With reference to FIGS. 6, 7, 8A, 8B, 9A, 9B, 9C, 10A, 10B, 11A and 11B, while the piezoelectric actuator according to a comparison example will be described, effects of the piezoelectric element 40 according to the embodiment will be described.

Figure 6:
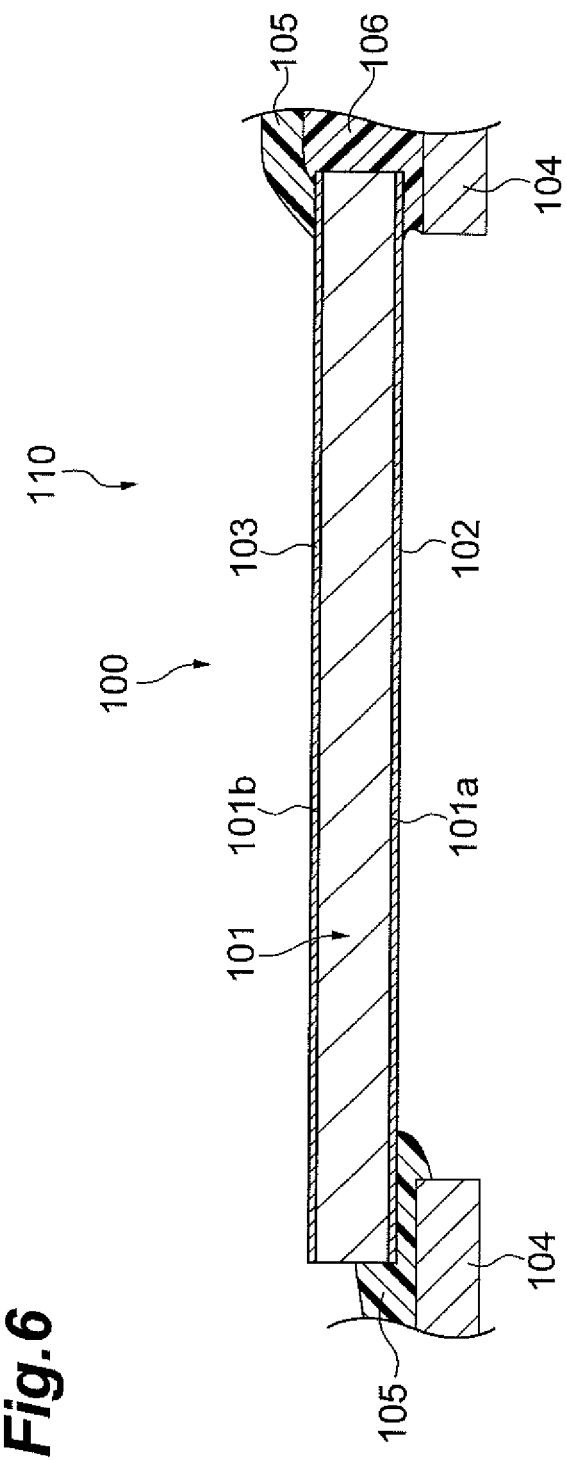
FIG. 6 is a view illustrating a suspension according to a comparison example.
Figure 7:
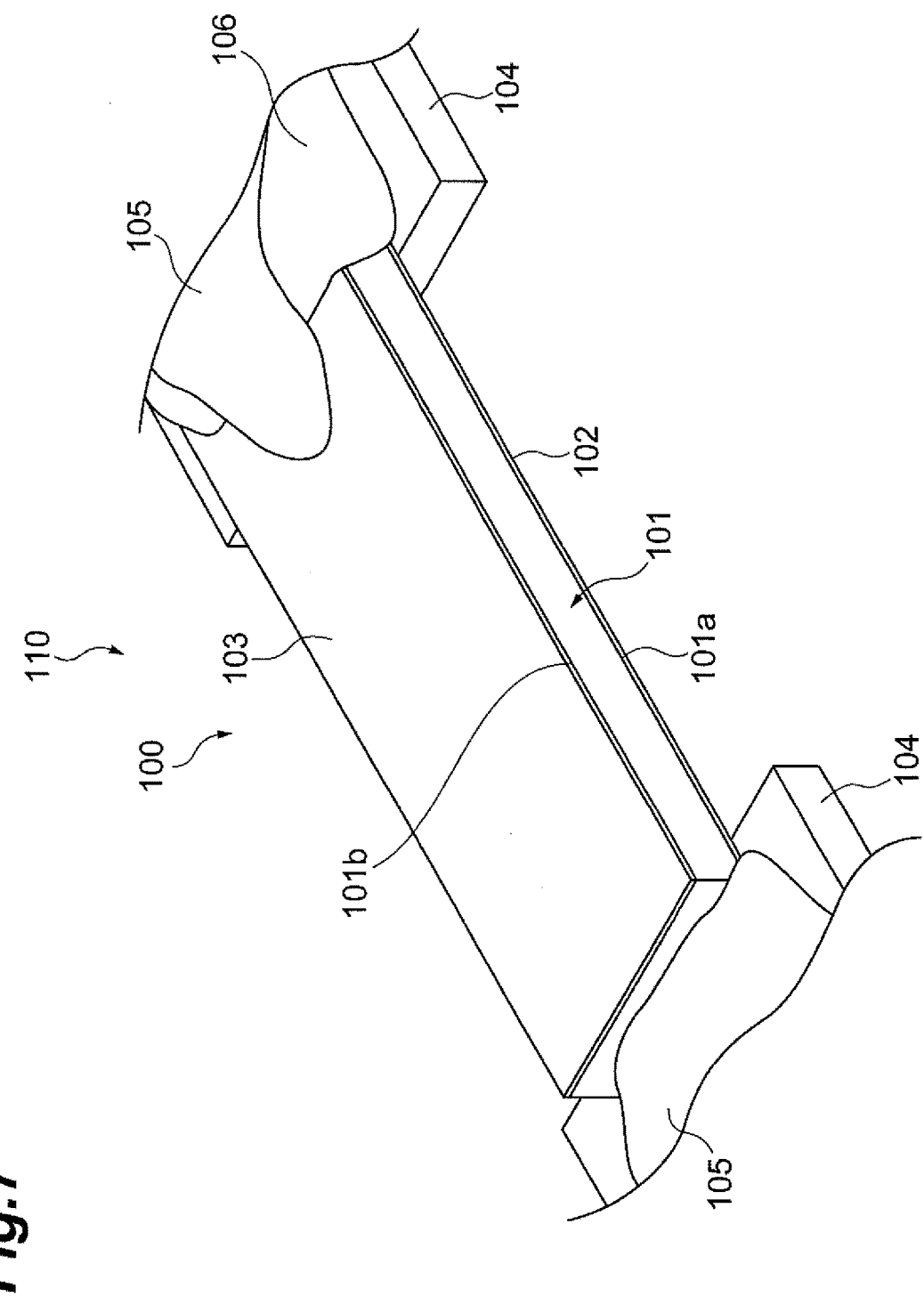
FIG. 7 is a perspective view illustrating a fixing structure of a piezoelectric element illustrated in FIG. 6.

FIG. 6 is a view illustrating a suspension according to a comparison example. FIG. 7 is a perspective view illustrating a fixing structure of a piezoelectric element illustrated in FIG. 6. As illustrated in FIGS. 6 and 7, a suspension 110 according to a comparison example includes a piezoelectric element 100 and a pair of supporting members 104 supporting the piezoelectric element 100. The piezoelectric element 100 includes a piezoelectric body 101 and external electrodes 102 and 103. The piezoelectric body 101 has a rectangular plate shape.

The piezoelectric body 101 includes a pair of main surfaces 101a and 101b opposing each other in a thickness direction. The external electrode 102 is disposed on the main surface 101a. The external electrode 103 is disposed on the main surface 101b. A thickness of the external electrode 102 and a thickness of the external electrode 103 are equal.

At both ends of the piezoelectric element 100, mainly the main surface 101a side is fixed to the supporting members 104 by conductive resins 105 and resin 106. That is, the piezoelectric element 100 is bound and supported by the supporting members 104 in a state in which a binding force acting from the main surface 101a side to the piezoelectric body 101 is larger than a binding force acting from the main surface 101b side to the piezoelectric body 101.

Figure 8A:
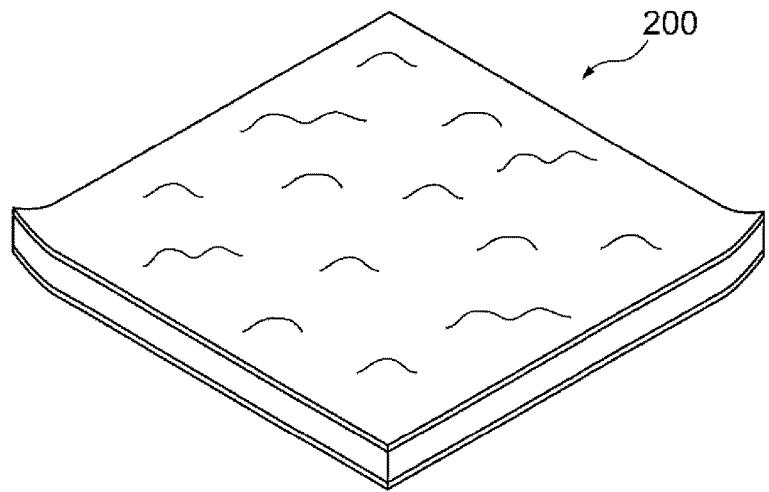
FIGS. 8A and 8B are views for describing a manufacturing method for the piezoelectric element illustrated in FIG. 6.
Figure 8B:
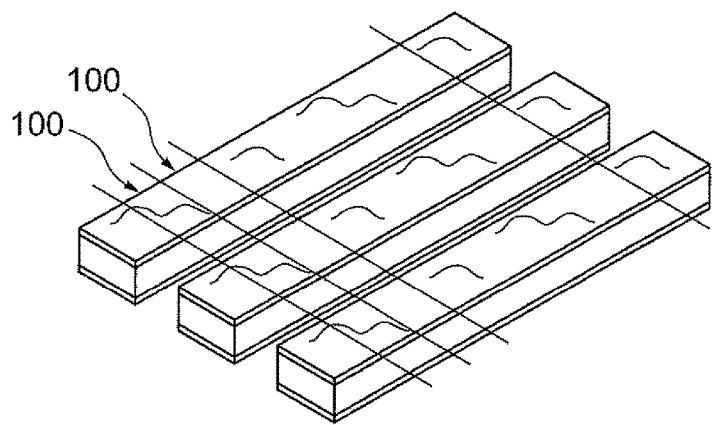

FIGS. 8A and 8B are views for describing a manufacturing method for the piezoelectric element illustrated in FIG. 6. First, a piezoelectric element substrate 200 as illustrated in FIG. 8A is prepared when the piezoelectric element 100 is manufactured. The piezoelectric element substrate 200 includes a piezoelectric substrate after firing, electrode films disposed on each main surface of the piezoelectric substrate. Distortion or bending occur during firing on the piezoelectric substrate. Such as the distortion or bending of the piezoelectric element substrate is reflected to the piezoelectric element substrate 200. Next, as illustrated in FIG. 8B, after the piezoelectric element substrate 200 is cut in a strip shape with a width corresponding to a length of the piezoelectric element 100 by dicing, the piezoelectric element substrate 200 is further cut to a width of the piezoelectric element 100 by dicing. As a result, diced piezoelectric elements 100 are obtained.

Figure 9A:
FIGS. 9A, 9B, and 9C are views for describing variation of the shapes of the piezoelectric elements illustrated in FIG. 6.
Figure 9B:
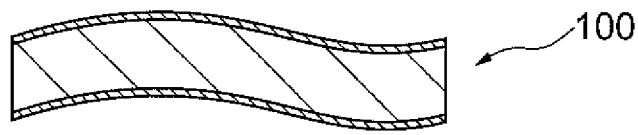
Figure 9C:
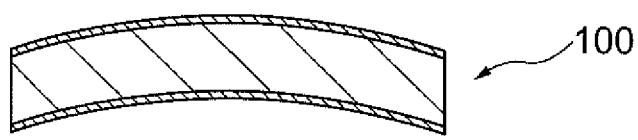

FIGS. 9A, 9B, and 9C are views for describing variation of the shapes of the piezoelectric elements illustrated in FIG. 6. The thinner the piezoelectric substrate itself becomes, or the thinner the layer of the substrate is made, the more remarkable the distortion and binding of the above-described piezoelectric substrate are. The distortion and bending of the piezoelectric substrate are corrected to some extent by an adhesive tape used in an annealing process and dicing. However, the distortion and bending are not perfectly removed. Therefore, a shape of the obtained piezoelectric element 100 is varied by each piezoelectric element 100. For example, a reasonable shape without distortion and bending illustrated in FIG. 9A, a distorted shape illustrated in FIG. 9B, and a bent shape illustrated in FIG. 9C are mixed. As a result, displacement of the piezoelectric elements 100 varies for each piezoelectric element 100.

In contrast, in the piezoelectric element 40 according to the embodiment, the polarizing region 411 is disposed on the first main surface 41a side, and the non-polarizing region 412 is disposed on the second main surface 41b side. Since distortion due to polarization is remained in the polarizing region 411, the piezoelectric element 40 has a bent shape in which the first main surface 41a comes to a curved inner side. Variation of the shapes of the piezoelectric elements 40 hardly occur since the shapes of the piezoelectric elements 40 are controlled by bending of the piezoelectric elements 40 caused by the polarizing region 411 and the non-polarizing region 412. As described above, the shapes of the piezoelectric elements 40 hardly vary and are uniform. Therefore, displacement variation is controlled in comparison with the piezoelectric elements 100 according to the comparison example, which have various shapes.

In the piezoelectric element 40, the distance t1 from the internal electrode 44 to the electrode portion 42a may be equal to or more than the distance t2 from the internal electrode 44 to the second main surface 41b. That is, a thickness of the polarizing region 411 is equal to or more than a thickness of the non-polarizing region 412. Therefore, for example, in comparison with a piezoelectric element in which a thickness of the polarizing region is less than a thickness of the non-polarizing region, the piezoelectric element 40 has certainly a bent shape. Further, a thickness of the piezoelectric element 40 is equal to or less than 100 μm, and therefore the piezoelectric element 40 is significantly affected by distortion remained in a polarizing region in comparison with a piezoelectric element of which thickness is larger than 100 μm. Therefore, the piezoelectric element 40 certainly has a bent shape.

Figure 10A:
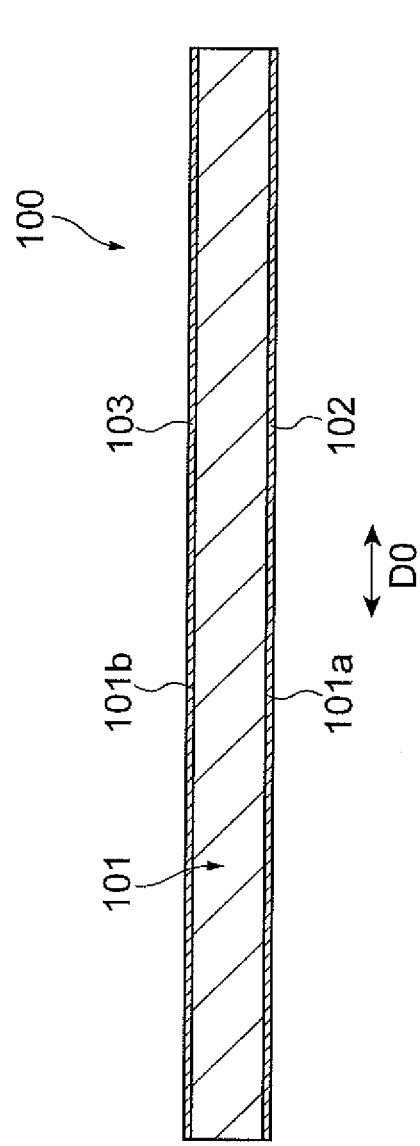
FIGS. 10A and 10B are views for describing movement of the piezoelectric element illustrated in FIG. 6.
Figure 10B:
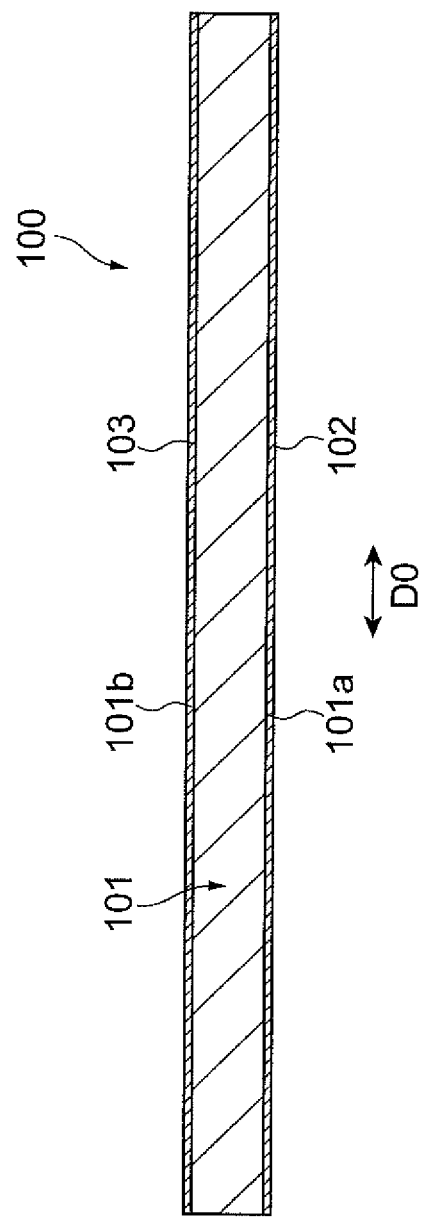

FIGS. 10A and 10B are views for describing movement of the piezoelectric element illustrated in FIG. 6. When a predetermined electrical field is applied to the piezoelectric body 101 through the external electrodes 102 and 103, the piezoelectric element 100 changes from the state before driving as illustrated in FIG. 10A to the state during driving as illustrated in FIG. 10B. The piezoelectric element 100 extends along a driving direction D0 in the state during driving. The driving direction D0 is a direction orthogonal to a direction opposing a pair of the main surfaces 101a and 101b.

FIGS. 11A and 11B are views for describing movement of the suspension illustrated in FIG. 6. As illustrated in FIG. 11A, the piezoelectric element 100 (piezoelectric body 101) is supported by the supporting members 104 substantially parallel to the driving direction D0 in the state before driving and therefore is not bending. However, when rigidity of the piezoelectric element 100 deteriorates, the piezoelectric element 100 bends and deforms in the state during driving as illustrated in FIG. 11B. That is, the piezoelectric element 100 is supported by being bound to the supporting members 104 in the above-described state. Therefore, in the state during driving, the piezoelectric element 100 bends such that the main surface 101b having a small binding force comes to a curved outer side. In this manner, when the piezoelectric element 100 bends and deforms, the piezoelectric element 100 cannot appropriately transmit displacement to the supporting members 104.

In contrast, in the piezoelectric element 40 according to the embodiment, a non-polarizing region 412 is a piezoelectrically inert region. Therefore, when the piezoelectric element 40 is displaced, a displacement amount on the first main surface 41a side becomes larger than a displacement amount on the second main surface 41b side. Therefore, the piezoelectric element 40 is bent such that the first main surface 41a comes to a curved outer side when the piezoelectric element 40 displaces in an extending direction. As a result, bending in which the first main surface 41a comes to a curved inner side and which occurs on the piezoelectric element 40 due to distortion remained in the polarizing region 411 is suppressed. Further, in the piezoelectric element 40, the first main surface 41a is bound and supported by the intermediate portion 32 and the base portion 30. Therefore, the intermediate portion 32 and the base portion 30 suppress that the piezoelectric element 40 bends such that the first main surface 41a comes to a curved outer side. As a result, the piezoelectric element 40 can appropriately transmit displacement to the intermediate portion 32 and the base portion 30.

When the piezoelectric element 100 according to the comparison example is displaced, as illustrated in FIG. 11B, the conductive resin 105 and the resin 106 are pulled in a direction vertical to the driving direction D0 and easily peeled. In contrast, when the piezoelectric element 40 according to the embodiment is displaced, as illustrated in FIG. 5B, the conductive resin 50 receives a compressing force in the first direction D1. Therefore, peeling of the conductive resin 50 is suppressed.

The electrode portion 42a of the piezoelectric element 40 is disposed on the first main surface 41a. Therefore, in comparison with the case where the second main surface 41b is supported by the intermediate portion 32 and the base portion 30, an adhesive area between the conductive resin 50 provided to the intermediate portion 32 and the electrode portion 42a can be increased since the first main surface 41a is supported by the intermediate portion 32 and the base portion 30.

The present invention is not limited to the above-described embodiment. The present invention may be changed within the gist described in each claim or may be applied to other embodiment.

In addition to the base portion 30 and the intermediate portion 32 of the hinge member 14, for example, the base portion 20 and the front end portion 22 of the base plate 13 and the connecting portion 24 of the base plate 13 may function as a supporting member.

In the piezoelectric element 40, the first external electrode 42 at least includes the electrode portion 42a and may not include the electrode portion 42b. The first and second external electrodes 42 and 43 may include the same material.

The present invention can be used in a piezoelectric actuator other than the micro actuator 12 of the suspension 10 for HDD.

What is claimed is:
1. A piezoelectric element, comprising:
   a piezoelectric body including first and second main surfaces opposing each other;
   an external electrode disposed on the first main surface and having a first polarity; and
   an internal electrode disposed in the piezoelectric body to oppose the external electrode in a direction in which the first main surface and the second main surface oppose each other and having a second polarity different from the first polarity,
   wherein a region from the internal electrode to the external electrode in the piezoelectric body is a polarizing region, and a region from the internal electrode to the second main surface in the piezoelectric body is a non-polarizing region.
2. The piezoelectric element according to claim 1, wherein a distance from the internal electrode to the external electrode is equal to or more than a distance from the internal electrode to the second main surface.
3. The piezoelectric element according to claim 1, wherein a thickness is equal to or less than 100 μm.
4. The piezoelectric element according to claim 2, wherein a thickness is equal to or less than 100 μm.
5. A piezoelectric actuator, comprising:
   the piezoelectric element according to claim 1; and
   a supporting member supporting the first main surface of the piezoelectric element via adhesive resin.

* * * * *